United States Patent [19]

Jeong

[11] Patent Number: 6,018,479
[45] Date of Patent: Jan. 25, 2000

[54] HIGH VOLTAGE GENERATING CIRCUIT FOR A SEMICONDUCTOR MEMORY DEVICE

[75] Inventor: Weon Hwa Jeong, Chungcheongbuk-do, Rep. of Korea

[73] Assignee: LG Semicon Co., Ltd., Cheongju, Rep. of Korea

[21] Appl. No.: 09/216,924

[22] Filed: Dec. 21, 1998

[30] Foreign Application Priority Data

Aug. 10, 1998 [KR] Rep. of Korea ............ 98-33169

[51] Int. Cl.$^7$ ................................... G11C 7/00
[52] U.S. Cl. ........................ 365/189.11; 365/226
[58] Field of Search ................... 365/189.11, 226, 365/229, 189.09; 327/536, 532

[56] References Cited

U.S. PATENT DOCUMENTS

| | | | |
|---|---|---|---|
| 5,216,588 | 6/1993 | Bajwa et al. | 365/226 |
| 5,406,517 | 4/1995 | Chang et al. | 365/189.09 |
| 5,694,365 | 12/1997 | Nakai | 365/226 |

OTHER PUBLICATIONS

Johnny C. Chen et al., "A 2.7V only 8Mbx16NOR Flash Memory", Jun. 13–15, 1996, 1996 Symposium on VLSI Circuits, pp. 172–173.

Primary Examiner—Tan T. Nguyen
Attorney, Agent, or Firm—Fleshner & Kim

[57] ABSTRACT

The high voltage generating circuit for a semiconductor memory device includes a first clock generator for generating first and second clock signals CLK1 and CLK1$a$ during read and standby mode and program and erasure mode, a first pump for outputting a constant high voltage from the first clock signal of the first clock generator during read and standby mode, or generating first and second pumping voltages during program and erasure mode, a first voltage adjustment portion for outputting a row decoder operation signal from the constant high voltage of the first pump during read and standby mode and maintaining high voltage during program and erasure mode, second and third clock generators for generating third and fourth clock signals CLK2 and CLK3, respectively, during program and erasure mode, a second pump for outputting a third pumping voltage from the third clock signal of the second clock generator and the first and second pumping voltages of the first pump during program and erasure mode, a third pump for outputting a fourth pumping voltage from the fourth clock signal of the third clock generator during program and erasure mode, a second voltage adjustment portion for controlling the operation of the first, second and third clock generators by inputting the third and fourth pumping voltages during program and erasure mode, and a voltage generator for outputting a constant high voltage to the first voltage adjustment portion during program and erasure mode.

16 Claims, 8 Drawing Sheets

HIGH VOLTAGE GENERATING CIRCUIT FOR A SEMICONDUCTOR MEMORY DEVICE

BACKGROUND OF THE INVENTION

1. Field of the Invention

The present invention relates to a semiconductor memory device, and more particularly, to a high voltage generating circuit for a semiconductor memory device, which generates a constant high voltage relatively higher than an external power source voltage VDD.

2. Discussion of the Related Art

A background art high voltage generating circuit for a semiconductor memory device will be described with reference to the accompanying drawings.

In the background art high voltage generating circuit for a semiconductor memory device, a flash memory is used as the semiconductor memory device.

Figure 1:
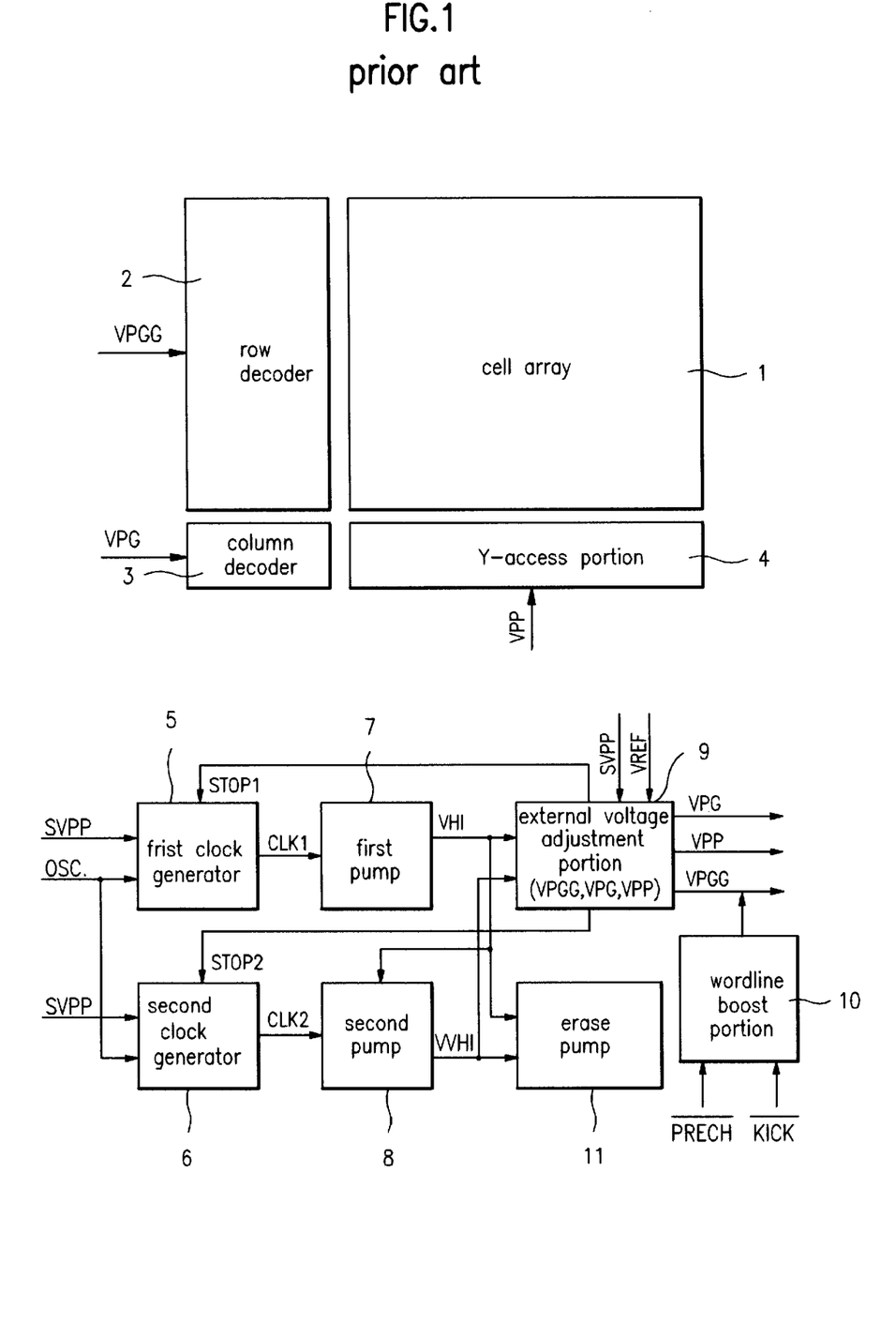
FIG. 1 is a block diagram illustrating a background art high voltage generating circuit for a semiconductor memory device.

FIG. 1 is a block diagram illustrating a background art high voltage generating circuit for a semiconductor memory device.

As shown in FIG. 1, the background art high voltage generating circuit for a semiconductor memory device includes a first clock generator 5, a second clock generator 6, a first pump 7, a second pump 8, an external voltage adjustment portion 9, an erase pump 11, and a wordline boost portion 10.

The first clock generator 5 outputs a first clock signal CLK1 by inputting an internal oscillator signal OSC and an enable signal SVPP enabled during program and erasure mode. The operation of the first clock generator 5 is controlled by a first control signal STOP1 from the external voltage adjustment portion 9.

The second clock generator 6 outputs a second clock signal CLK2 by inputting the external oscillator signal OSC and the enable signal SVPP enabled during program and erasure mode. The operation of the second clock generator 6 is controlled by a second control signal STOP2 from the external voltage adjustment portion 9.

The first pump 7 outputs a first pumping voltage VHI of high level by inputting the first clock signal CLK1. The second pump 8 outputs a second pumping voltage VVHI higher than the first pumping voltage VHI by inputting the second clock signal CLK2 and the first pumping voltage VHI.

The external voltage adjustment portion 9 receives the first and second pumping voltages VHI and VVHI, the enable signal SVPP and a reference voltage VREF, and outputs the first and second control signals STOP1 and STOP2 for controlling the first and second clock generators 5 and 6. The external voltage adjustment portion 9 outputs external control voltages VPGG, VPG and VPP to a row decoder 2, a column decoder 3, and a Y-access portion 4, respectively.

The wordline boost portion 10 boosts voltage of a wordline during read mode so as to output it to the row decoder 2.

The erase pump 11 outputs an erase voltage by inputting the first and second pumping voltages VHI and VVHI.

Each block of the aforementioned background art high voltage generating circuit for a semiconductor memory device will be described below.

Figure 2:
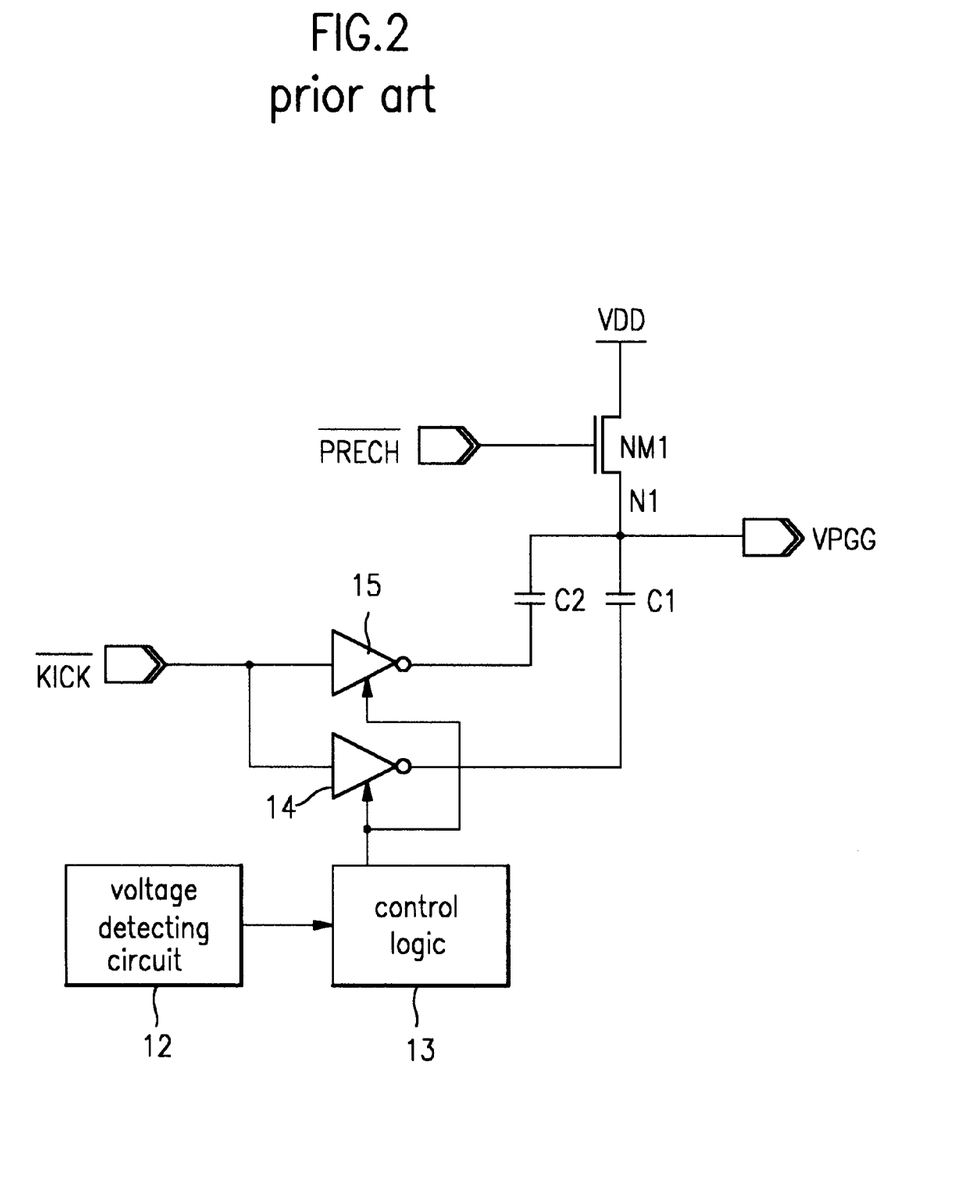
FIG. 2 is a circuit diagram illustrating a wordline boost portion of FIG. 1.

As shown in FIG. 2, the wordline boost portion 10 includes a first NMOS transistor NM1 whose drain electrode is connected to a power source voltage VDD terminal, for being operated by inputting a precharge bar signal $\overline{PRECH}$ to a gate electrode, first and second inverters 14 and 15 connected between a clock signal $\overline{KICK}$ input terminal and a source electrode of the first NMOS transistor NM1, for inverting the clock signal $\overline{KICK}$, a first capacitor C1 formed between the first inverter and the source electrode of the first NMOS transistor NM1, a second capacitor C2 formed between the second inverter and the source electrode of the first NMOS transistor NM1, a control logic 13 for outputting an enable signal for enabling the first and second inverters 14 and 15, and a voltage detecting circuit 12 for outputting a voltage which operates the control logic 13. The boosted wordline voltage VPGG is output through a junction node N1 between the first NMOS transistor NM1 and the first and second capacitors C1 and C2.

The first pump 7 includes a plurality of pumping operation portions (first, second, third, fourth and fifth pumping operation portions) for pumping the power source voltage to high voltage by inputting the first clock signal CLK1 of the first clock generator 5, and a control signal generator for generating first and second switching voltages TCKX and TCKY for transferring the pumped voltage of each pumping operation portion to the next node.

The first pumping operation portion of the first pump, which outputs the first and second pumping voltages, will be described with reference to FIG. 3a.

Figure 3A:
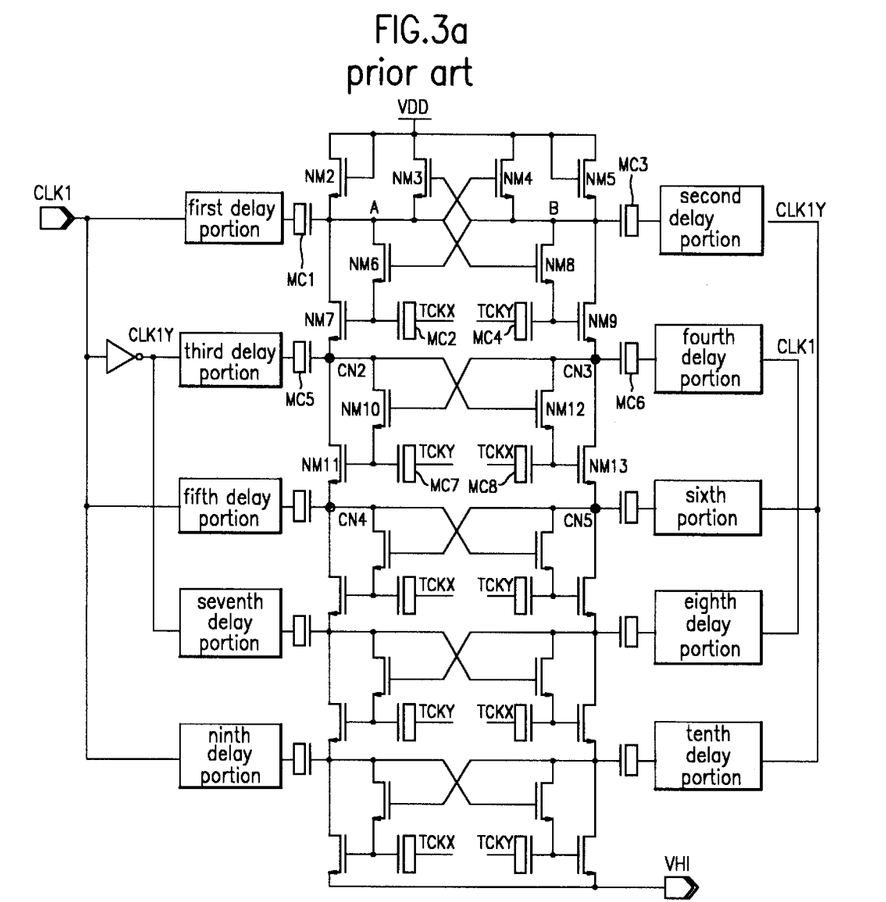
FIGS. 3a–3b are circuit diagrams illustrating a first pump of FIG. 1.

As shown in FIG. 3a, the first pumping operation portion includes second, third, fourth and fifth NMOS transistors NM2, NM3, NM4 and NM5 whose one electrodes are commonly connected to the power source voltage VDD terminal, a first MOS capacitor MC1 connected between the other electrode of the second NMOS transistor NM2 and a first delay portion for delaying the first clock signal CLK1, a seventh NMOS transistor NM7 connected between the other electrode of the second NMOS transistor NM2 and a second contact node CN2, a sixth NMOS transistor NM6 connected between the other electrode of the second NMOS transistor NM2 and a gate electrode of the seventh NMOS transistor NM7, whose gate electrode is connected to a gate electrode of the third NMOS transistor NM3 and the other electrode of the fourth NMOS transistor NM4, a first switching voltage TCKX input terminal for controlling the seventh NMOS transistor NM7, a second MOS capacitor MC2 formed between the first switching voltage TCKX input terminal and the gate electrode of the seventh NMOS transistor NM7, a third MOS capacitor MC3 between the other electrode of the fifth NMOS transistor NM5 and a second delay portion for delaying an inverted signal CLK1Y of CLK1, a ninth NMOS transistor NM9 connected between the other electrode of the fifth NMOS transistor NM5 and a third contact node CN3, an eighth NMOS transistor NM8 formed between the other electrode of the fifth NMOS transistor NM5 and a gate electrode of the ninth NMOS transistor NM9, whose gate electrode is connected to the gate electrode of the fourth NMOS transistor NM4 and the other electrode of the third NMOS transistor NM3, a second switching voltage TCKY input terminal for controlling the ninth NMOS transistor NM9, and a fourth MOS capacitor MC4 formed between the second switching voltage TCKY input terminal and the gate electrode of the ninth NMOS transistor NM9.

The second pumping operation portion for pumping the first and second pumping voltages to third and fourth pumping voltages includes a fifth MOS capacitor MC5 connected between the second contact node CN2 and a third delay portion for delaying the CLK1Y signal, an eleventh NMOS transistor NM11 formed between the second contact node CN2 and a fourth contact node CN4, a tenth NMOS transistor NM10 formed between the second contact node CN2 and a gate electrode of the eleventh NMOS transistor NM11, a second switching voltage TCKY input terminal of the first pump for inputting a control signal of the eleventh NMOS transistor NM11, a seventh MOS capacitor MC7 connected between the gate electrode of the eleventh NMOS transistor NM11 and the second switching voltage TCKY input terminal, a sixth MOS capacitor MC6 connected between the third contact node CN3 and a fourth delay portion for delaying the first clock signal CLK1, a thirteenth NMOS transistor NM13 formed between the third contact node CN3 and a fifth contact node CN5, a twelfth NMOS transistor NM12 formed between the third contact node CN3 and the gate electrode of the thirteenth NMOS transistor NM13, a first switching voltage TCKX input terminal of the first pump for controlling the thirteenth NMOS transistor NM13, and an eighth MOS capacitor MC8 connected between the gate electrode of the thirteenth NMOS transistor NM13 and the first switching voltage TCKX input terminal. The gate electrode of the tenth NMOS transistor NM10 is connected to the third contact node CN3 and the gate electrode of the twelfth NMOS transistor NM12 is connected to the second contact node CN2.

The third pumping operation portion has the same construction as the second pumping operation portion except that CLK1Y and CLK1 are changed to each other, and the first switching voltage TCKX of the first pump and the second switching voltage TCKY of the first pump are changed to each other.

The fourth pumping operation portion has the same construction as the second pumping operation portion.

The fifth pumping operation portion has the same construction as the third pumping operation portion.

The control signal generator for outputting the first switching voltage TCKX of the first pump and the second switching voltage TCKY of the first pump will be described with reference to FIG. 3b.

Figure 3B:
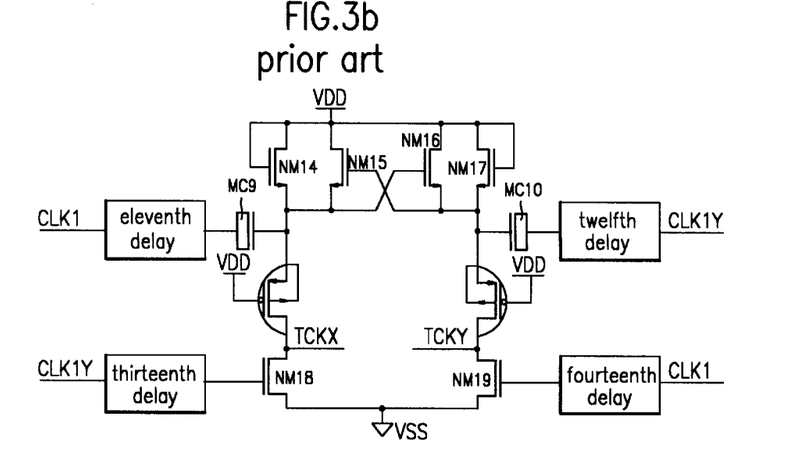

As shown in FIG. 3b, the control signal generator includes fourteenth, fifteenth, sixteenth and seventeenth NMOS transistors NM14, NM15, NM16 and NM17 whose one electrodes are commonly connected to the power source voltage VDD terminal, a ninth MOS capacitor MC9 connected between the other electrode of the fourteenth NMOS transistor NM14 and an eleventh delay portion for delaying the first clock signal CLK1, a first PMOS pass transistor whose one electrode is connected to the other electrode of the fourteenth NMOS transistor NM14, for passing the first switching voltage TCKX, an eighteenth NMOS transistor NM18 connected between the other electrode of the first PMOS pass transistor and the ground voltage VSS terminal, for being operated by a signal of a thirteenth delay portion for delaying the CLK1Y signal, a tenth MOS capacitor MC10 connected between the other electrode of the seventeenth NMOS transistor NM17 and a twelfth delay portion for delaying the CLK1Y signal, a second PMOS pass transistor whose one electrode is connected to the other electrode of the seventeenth NMOS transistor NM17, for passing the second switching voltage TCKY of the first pump, and a ninth NMOS transistor NM19 connected between the other electrode of the second PMOS pass transistor and the ground voltage VSS terminal, for being operated by a signal of a fourteenth delay portion for delaying the CLK1 signal. The gate electrode of the fifteenth NMOS transistor NM15 is connected to the other electrodes of the sixteenth and seventeenth NMOS transistors NM16 and NM17, and the gate electrode of the sixteenth NMOS transistor NM16 is connected to the other electrodes of the fourteenth and fifteenth NMOS transistors NM14 and NM15. One electrodes of the fourteenth and seventeenth NMOS transistors NM14 and NM17 are connected to each gate electrode thereof. The power source voltage VDD is applied to the gate electrodes of the first and second PMOS pass transistors.

The operation of the aforementioned background art high voltage generating circuit for a semiconductor memory device will be described below.

As shown in FIG. 1, during program and erasure mode, the first and second clock generators 5 and 6 generate the first and second clock signals CLK1 and CLK2 by inputting the program and erasure enable signal SVPP, the internal OSC signal, and the control signals STOP1 and STOP2 of the external voltage adjustment portion 9. The first pump 7 to which the first clock signal is input outputs high voltage of VHI for program and erasure by pumping operation as shown in FIGS. 3a and 3b. At this time, VHI voltage is pumped to a high voltage of 6 VDD by the first pump 7. Likewise, the second pump 8 to which the second clock signal is input outputs high voltage VVHI by repeated pumping operation. Thereafter, the external voltage adjustment portion 9 which receives the pumped voltages VHI and VVHI outputs VPGG to the row decoder 2 for outputting the wordline control signal to the semiconductor memory cell, and supplies VPG and VPP to the column decoder 3 and the Y-access portion 4, respectively, for outputting drain control signals of the semiconductor memory cell.

At this time, if VHI and VVHI are higher than a target voltage, the external voltage adjustment portion 9 enables the control signals STOP1 and STOP2 to disable the first and second clock signals, so that the pumping operation is stopped. If VHI and VVHI are lower than the target voltage, the external voltage adjustment portion 9 disables the control signals STOP1 and STOP2 to enable the first and second clock signals, so that the pumping operation continues. Such a high voltage is applied to the semiconductor memory device so that program and erasure operation can be performed.

At read and standby mode, VPGG, VPG, and VPP voltage are output to the semiconductor memory device by the aforementioned operation. If the memory cell is erased, threshold voltage of the memory cell has an almost constant value regardless of the external voltage such as VDD. At this time, if the external voltage VDD becomes low, threshold voltage of the erased cell has a value relatively higher than VDD. Thus, current value of the erased cell is greatly varied. Finally, speed for reading the cell becomes slow.

In reading operation, if the wordline control voltage VPGG of the semiconductor memory cell is output by the wordline boost portion 10, as shown in FIG. 2, the wordline voltage level is adjusted by the VDD voltage detecting circuit 12, the control logic 13, the first and second inverters, and the first and second capacitors. At this time, if the precharge bar signal becomes high to turn on the first NMOS transistor, the wordline control voltage VPGG is boosted to the junction node N1. At this time, the wordline control voltage depending on the external power source voltage VDD is greatly varied and the external power source voltage is sensitive to noise, thereby causing error of the chip. Also, when the external power source voltage VDD level has the maximum value, the wordline control voltage VPGG becomes high.

The aforementioned background art high voltage generating circuit for a semiconductor memory device has several problems.

First, in case of reading operation at low power source voltage, threshold voltage of the erased cell is distributed relatively higher than the power source voltage, thereby causing slow reading operation speed. In addition, since the wordline control voltage level is greatly varied when the power source voltage has the maximum value, program is disturbed during reading operation, thereby deteriorating reliability of the operation.

SUMMARY OF THE INVENTION

Accordingly, the present invention is directed to a high voltage generating circuit for a semiconductor memory device that substantially obviates one or more of the problems due to limitations and disadvantages of the related art.

An object of the present invention is to provide a high voltage generating circuit for a semiconductor memory device, which generates a constant high voltage relatively higher than an external power source voltage VDD.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a high voltage generating circuit for a semiconductor memory device according to the present invention having a memory cell array, and a row decoder, a column decoder and a Y-access portion for operating the memory cell array, includes a first clock generator for generating first and second clock signals CLK1 and CLK1a during read and standby mode and program and erasure mode, a first pump for outputting a constant high voltage from the first clock signal of the first clock generator during read and standby mode, or generating first and second pumping voltages during program and erasure mode, a first voltage adjustment portion for outputting a row decoder operation signal from the constant high voltage of the first pump during read and standby mode and maintaining high voltage during program and erasure mode, second and third clock generators for generating third and fourth clock signals CLK2 and CLK3, respectively, during program and erasure mode, a second pump for outputting a third pumping voltage from the third clock signal of the second clock generator and the first and second pumping voltages of the first pump during program and erasure mode, a third pump for outputting a fourth pumping voltage from the fourth clock signal of the third clock generator during program and erasure mode, a second voltage adjustment portion for controlling the operation of the first, second and third clock generators by inputting the third and fourth pumping voltages during program and erasure mode, and outputting each operation voltage of the row decoder, the column decoder and the Y-access portion, and a voltage generator for outputting a constant high voltage to the first voltage adjustment portion during program and erasure mode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In a high voltage generating circuit for a semiconductor memory device according to the present invention, a flash memory is used as the semiconductor memory device.

Figure 4:
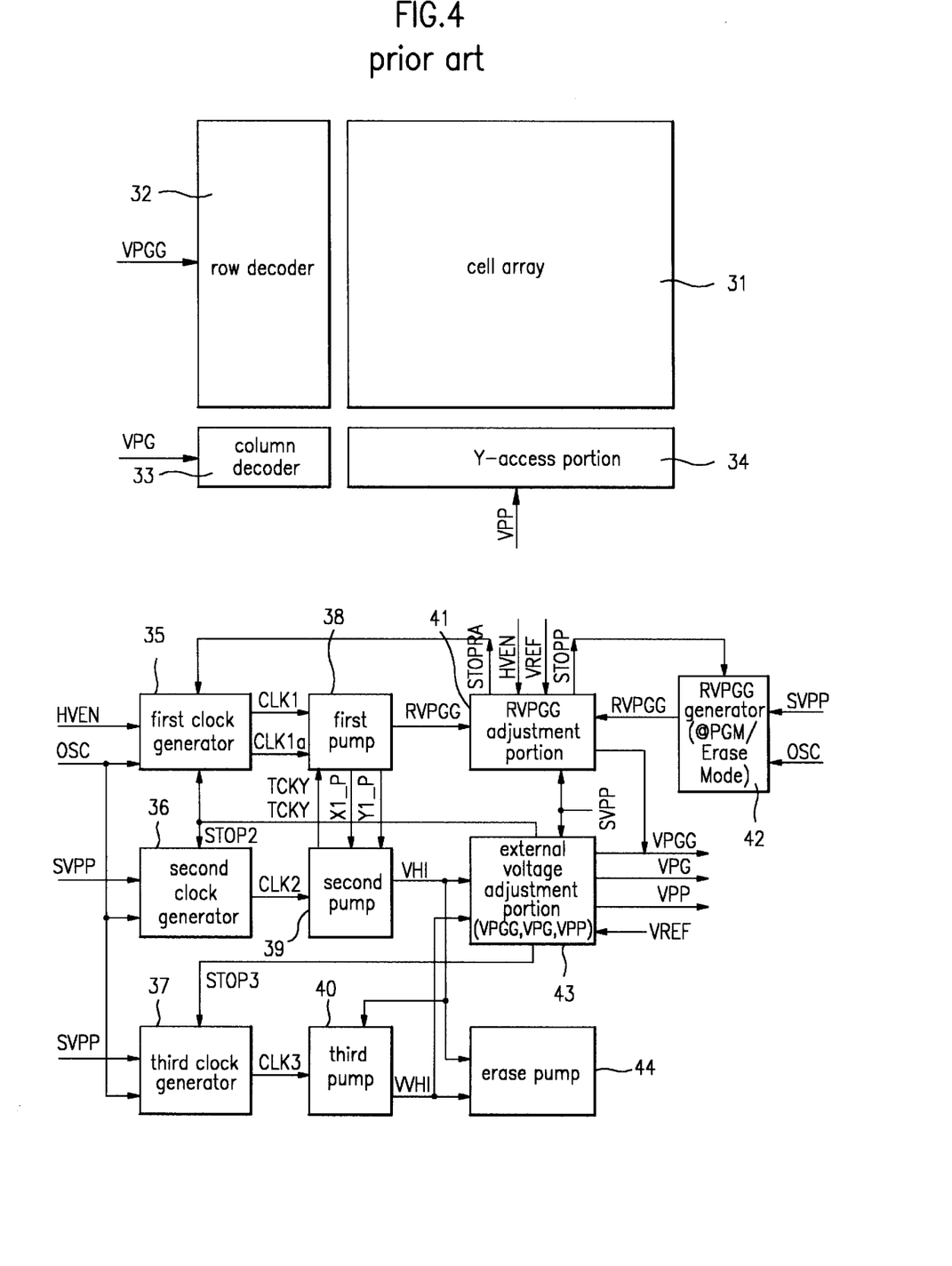
FIG. 4 s a block diagram illustrating a high voltage generating circuit for a semiconductor memory device according to the present invention.

As shown in FIG. 4, the high voltage generating circuit for a semiconductor memory device according to the present invention includes first, second and third clock generators 35, 36 and 37, first, second and third pumps 38, 39 and 40, an RVPGG adjustment portion 41, an RVPGG generator 42, an external voltage adjustment portion 43, and an erase pump 44.

The first clock generator 35 which is operated during read and standby mode outputs CLK1 and CLK1a to the first pump 38 by inputting an OSC signal, HVEN signal, a second stop signal STOP2 and STOPRA signal. The OSC signal is generated by an internal oscillator, HVEN signal is a read and standby enable signal, STOP2 signal is a clock stop signal output from the external voltage adjustment portion 43, STOPRA signal is a control signal output from the RVPGG adjustment portion 41, and RVPGG is a constant high voltage for adjusting an external control voltage which will be output to a row decoder.

The second clock generator 36 which is used for program and erasure mode outputs CLK2 to the second pump 39 by inputting OSC signal, SVPP signal and STOP2 signal. At this time, SVPP signal is enabled during program and erasure mode.

The third clock generator 37 which is operated during program and erasure mode outputs CLK3 to the third pump 40 by inputting OSC signal, SVPP signal and a third stop signal STOP3.

The first pump 38, during program and erasure mode, receives CLK1 signal output from the first clock generator 35 and outputs a first pumping voltage X1_P and a second pumping voltage Y1_P to the second pump 39. The first pump 38, during read and standby mode, receives CLK1a signal and outputs RVPGG signal to the RVPGG adjustment portion 41.

The second pump 39, during program and erasure mode, receives CLK2 signal output from the second clock generator 36 and the first and second pumping voltages X1_P and Y1_P from the first pump 38, and outputs VHI signal to the external voltage adjustment portion 43 and the erase pump 44.

The third pump 40, during program and erasure mode, receives CLK3 signal output from the third clock generator 37 and VHI signal output from the second pump 39, and outputs VVHI signal to the external voltage adjustment portion 43 and the erase pump 44.

The RVPGG adjustment portion 41 receives HVEN signal, VREF signal, SVPP signal and RVPGG signal, and outputs STOPRA signal, STOPP signal and VPGG signal.

At this time, VPGG is an external control voltage applied to the row decoder which is involved in the operation of the semiconductor memory device, VREF is a reference voltage, STOPRA is a control signal of the first clock generator 35, and STOPP is a control signal of the RVPGG generator 42.

The RVPGG generator 42, during program and erasure mode, receives OSC signal, SVPP signal and STOPP signal, and outputs RVPGG to the RVPGG adjustment portion 41.

The external voltage adjustment portion 43 receives VHI signal output from the second pump 39, VVHI signal output from the third pump 40, SVPP signal and VREF signal, and outputs VPGG signal, VPG signal, VPP signal, STOP2 signal and STOP3 signal.

At this time, VPGG is an external control voltage for operating the row decoder 32, VPG is an external control voltage for operating the column decoder 33, VPP is an external control voltage applied to the Y-access portion 34, and STOP2 and STOP3 are control signals for controlling the first and second clock generators 35 and 36 and the third clock generator 37, respectively, to control the pumping operation of the second and third pumps 39 and 40.

The erase pump 44 receives VHI signal and VVHI signal from the second and third pumps 39 and 40, respectively, and transfers a voltage for erasing the semiconductor memory device such as a flash memory device to the semiconductor memory device.

The aforementioned high voltage generating circuit for a semiconductor memory device according to the present invention will be described in detail.

Figure 5A:
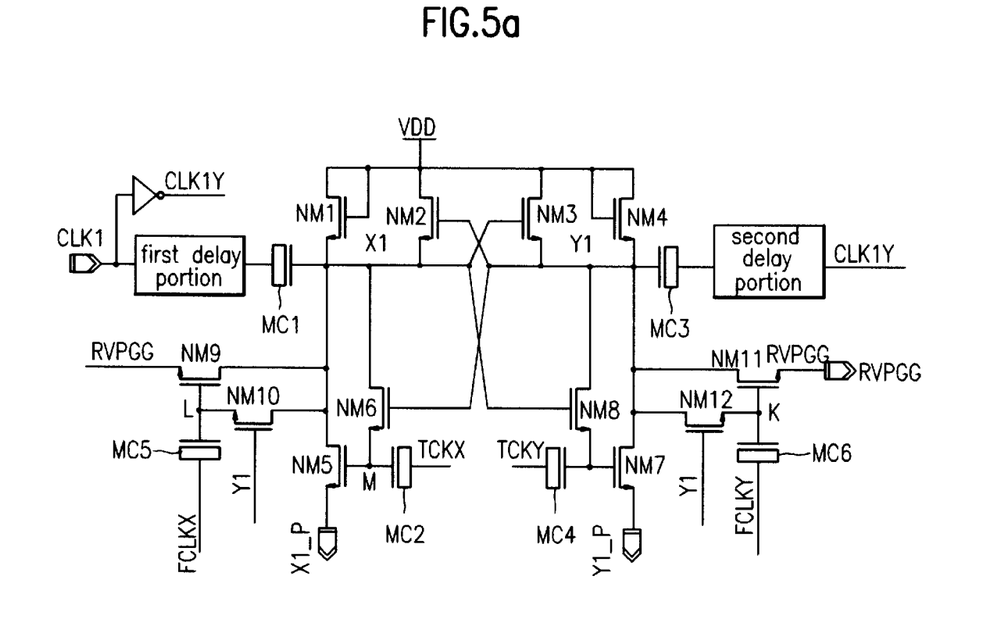
FIGS. 5a–5b are circuit diagrams illustrating a first pump of FIG. 4.
Figure 5B:
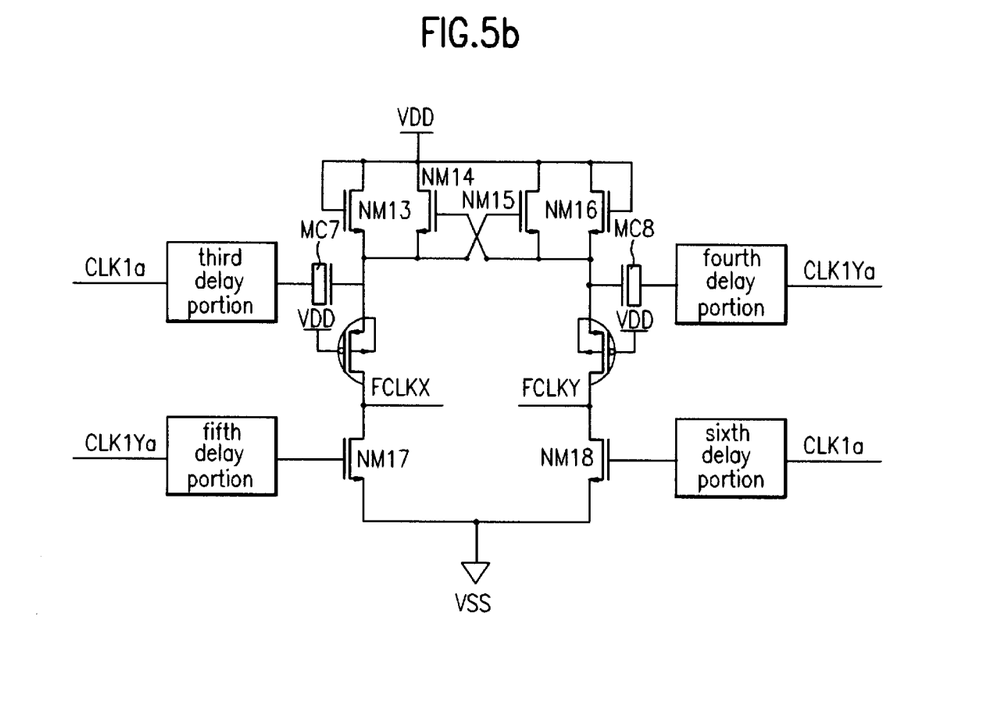

As shown in FIG. 5a, the first pump 38, during program and erasure mode, receives CLK1 signal output from the first clock generator 35 and transfers X1_P signal and Y1_P signal to the second pump 39, and outputs RVPGG voltage during read and standby mode. In FIG. 5b, there is shown a circuit for outputting FCLKX to output RVPGG voltage during read and standby mode.

First, as shown in FIG. 5a, the first pump 38 used for program and erasure mode includes first, second, third and fourth NMOS transistors NM1, NM2, NM3 and NM4 whose one electrodes are commonly connected to the power source voltage terminal VDD, a first MOS capacitor MC1 connected between the other electrode of the first NMOS transistor NM1 and a first delay portion for delaying CLK1 signal, a fifth NMOS transistor NM5 whose one electrode is connected to the other electrode of the first NMOS transistor NM1, a sixth NMOS transistor NM6 connected between the other electrodes of the first and second NMOS transistors NM1 and NM2 and a gate electrode of the fifth NMOS transistor NM5, whose gate electrode is connected to a gate electrode of the second NMOS transistor NM2 and the other electrode of the third NMOS transistor NM3, a second MOS capacitor MC2 formed between the other electrode of the sixth NMOS transistor NM6 and a first switching voltage TCKX input terminal for outputting the first pumping voltage X1_P, a third MOS capacitor MC3 connected between the other electrode of the fourth NMOS transistor NM4 and a second delay portion for delaying CLK1Y signal, a seventh NMOS transistor NM7 whose one electrode is connected to the other electrode of the fourth NMOS transistor NM4, an eighth NMOS transistor NM8 connected between the other electrodes of the third and fourth NMOS transistors NM3 and NM4 and a gate electrode of the seventh NMOS transistor NM7, whose gate electrode is connected to the gate electrode of the third NMOS transistor NM3 and the other electrode of the second NMOS transistor NM2, and a fourth MOS capacitor MC4 formed between the other electrode of the eighth NMOS transistor NM8 and a second switching voltage TCKY input terminal for outputting the second pumping voltage Y1_P of the first pump 38. The one electrodes of the first and fourth NMOS transistors NM1 and NM4, which are connected to the power source voltage VDD terminal, are connected to each gate electrode thereof.

The first pump 38 for outputting a constant high voltage during read and standby mode includes a ninth NMOS transistor NM9 whose one electrode is connected to the other electrode of the first NMOS transistor NM1, a fifth MOS capacitor MC5 connected between a third switching voltage FCLKX input terminal for controlling the operation of the ninth NMOS transistor NM9 and a gate electrode of the NMOS transistor NM9, a tenth NMOS transistor NM10 connected between the one electrode of the ninth NMOS transistor NM9 and the gate electrode of the ninth NMOS transistor NM9, an eleventh NMOS transistor NM11 whose one electrode is connected to the other electrode of the fourth NMOS transistor NM4, a sixth MOS capacitor MC6 connected between a hi fourth switching voltage FCLKY input terminal for controlling the operation of the eleventh NMOS transistor NM11 and a gate electrode of the eleventh NMOS transistor NM11, and a twelfth NMOS transistor NM12 connected between the one electrode of the eleventh NMOS transistor NM11 and the gate electrode of the eleventh NMOS transistor NM11.

A circuit for outputting the third and fourth switching voltages FCLKX and FCLKY during read and standby mode will be described with reference to FIG. 5b.

As shown in FIG. 5b, the circuit for outputting the third and fourth switching voltages FCLKX and FCLKY includes thirteenth, fourteenth, fifteenth and sixteenth NMOS transistors NM13, NM14, NM15 and NM16 whose one electrodes are commonly connected to the power source voltage VDD terminal, a seventh MOS capacitor MC7 connected between the other electrode of the thirteenth NMOS transistor NM13 and a third delay portion for delaying CLK1a signal, a first PMOS pass transistor whose one electrode is connected to the other electrode of the thirteenth NMOS transistor NM13, for outputting the third switching voltage FCLKX, a seventeenth NMOS transistor NM17 formed between the other electrode of the first PMOS pass transistor and the ground voltage VSS terminal, for being operated by inputting a signal of a fifth delay portion for delaying CLK1Ya signal, an eighth MOS capacitor MC8 connected between the other electrode of the sixteenth NMOS transistor NM16 and a fourth delay portion for delaying CLK1Ya, a second PMOS pass transistor whose one electrode is connected to the other electrode of the sixteenth NMOS transistor NM16, for outputting a fourth switching voltage FCLKY, and an eighteenth NMOS transistor NM18 formed between the other electrode of the second PMOS pass transistor and the ground voltage VSS terminal, for being operated by inputting a signal of a sixth delay portion for delaying CLK1a signal. The gate electrode of the fourteenth NMOS transistor is connected to the other electrodes of the fifth and sixth NMOS transistors NM15 and NM16, and the gate electrode of the fifth NMOS transistor NM15 is connected to the other electrodes of the thirteenth and fourteenth NMOS transistors. The one electrodes of the thirteenth and sixteenth NMOS transistors NM13 and NM16, which are connected to the power source voltage VDD terminal, are connected to each gate electrode thereof. The VDD is applied to the gate electrodes of the first and second PMOS pass transistors.

CLK1 signal and CLK1a signal of the first pump 38 are synchronized, and CLK1Y is an inverted signal of CLK1. In addition, CLK1Ya is an inverted signal of CLK1a.

Figure 6A:
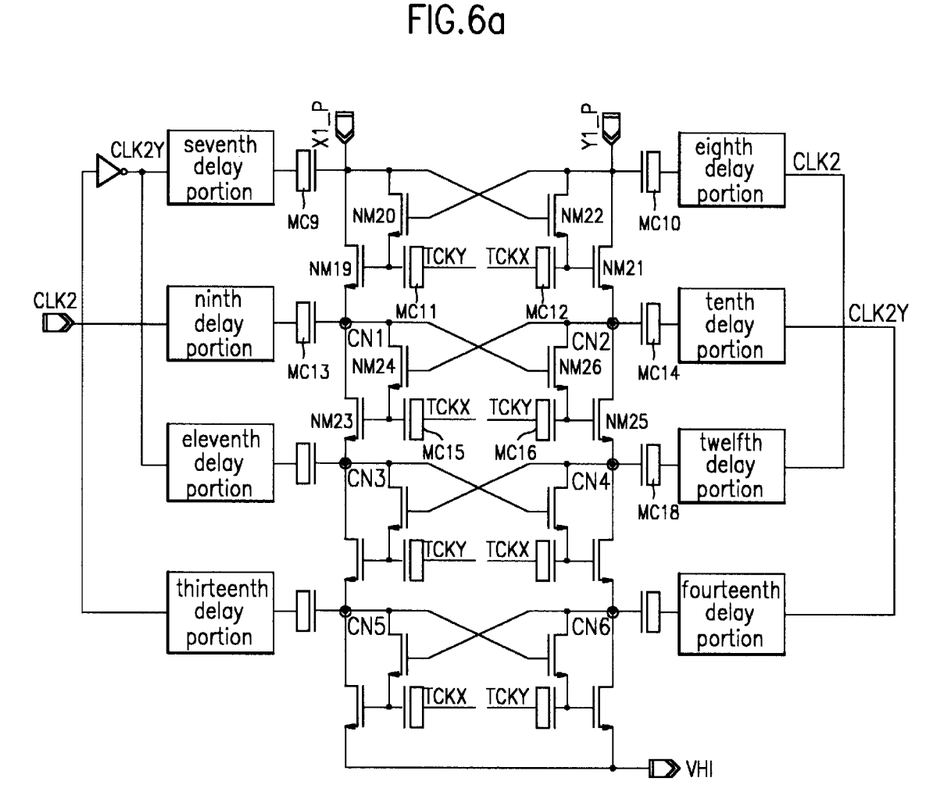
FIGS. 6a–6b are circuit diagrams illustrating a second pump of FIG. 4.
Figure 6B:
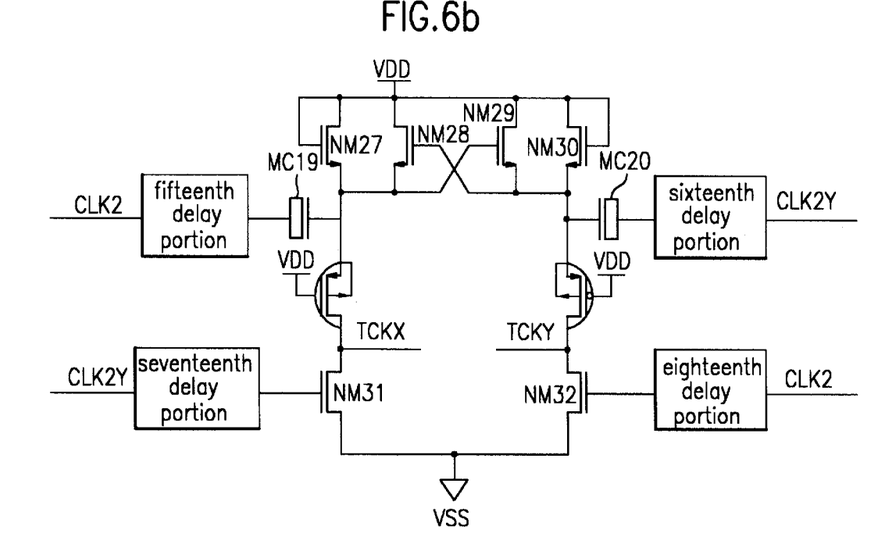

As shown in FIG. 6a–FIG. 6b, the second pump 39 includes a plurality of pumping operation portions for pumping the first and second pumping voltages X1_P and Y1_P of the first pump 38 in turn during program and erasure mode, and a control signal generator for generating first and second switching voltages TCKX and TCKY to transfer the pumped voltage of each pumping operation portion to the next node.

First, as shown in FIG. 6a, the circuit for performing in turn the pumping operation pumps the first and second pumping voltages X1_P and Y1_P pumped from the first pump 38 a plurality of times to produce a desired voltage. In FIG. 6a, the pumping circuit pumps four times and includes first, second, third and fourth pumping operation portions.

The first pumping operation portion includes a ninth MOS capacitor MC9 formed between a first pumping voltage X1_P output node of the first pump 38 and a seventh delay portion for delaying an inverted signal CLK2Y of CLK2, a nineteenth NMOS transistor NM19 formed between the first pumping voltage X1_P output node and the first contact node CN1, a twentieth NMOS transistor NM20 formed between the first pumping voltage X1_P output node and a gate electrode of the nineteenth NMOS transistor NM19, a second switching voltage TCKY input terminal for controlling the nineteenth NMOS transistor NM19, an eleventh MOS capacitor MC11 formed between the gate electrode of the nineteenth NMOS transistor NM19 and the second switching voltage TCKY input terminal of the second pump, a tenth MOS capacitor MC10 connected between a second pumping voltage Y1_P output node of the first pump and an eighth delay portion for delaying CLK2, a twenty-first NMOS transistor NM21 formed between the second pumping voltage Y1_P and the second contact node CN2, a twenty-second NMOS transistor NM22 formed between the second pumping voltage Y1_P output node and a gate electrode of the twenty-first NMOS transistor NM21, a first switching voltage TCKX input terminal for controlling the twenty-first NMOS transistor NM21, and a twelfth MOS capacitor MC12 connected between the gate electrode of the twenty-first NMOS transistor NM21 and the first switching voltage TCKX input terminal.

The second pumping operation portion includes a thirteenth MOS capacitor MC13 formed between the first contact node CN1 and a ninth delay portion for delaying CLK2Y, a twenty-third NMOS transistor NM23 formed between the first contact node CN1 and the third contact node CN3, a twenty-fourth NMOS transistor NM24 formed between the first contact node CN1 and a gate electrode of the twenty-third NMOS transistor NM23, a first switching voltage TCKX input terminal for controlling the twenty-third NMOS transistor NM23, a fifteenth MOS capacitor MC15 connected between the gate electrode of the twenty-third NMOS transistor NM23 and the first switching voltage TCKX input terminal, a fourteenth MOS capacitor MC14 connected between the second contact node CN2 and a tenth delay portion for delaying CLK2Y, a twenty-fifth NMOS transistor NM25 formed between the second contact node CN2 and the fourth contact node CN4, a twenty-sixth NMOS transistor NM26 formed between the second contact node CN2 and a gate electrode of the twenty-fifth NMOS transistor NM25, a second switching voltage TCKY input terminal for controlling the twenty-fifth NMOS transistor NM25, and an eighteenth MOS capacitor MC18 connected between the gate electrode of the twenty-fifth NMOS transistor NM25 and the second switching voltage TCKY input terminal.

The third and fourth pumping operation portions have the same construction as the first and second pumping operation portions, respectively. The pumping voltage VHI is output to the final node of the fourth pumping operation portion.

As shown in FIG. 6b, the control signal generator for generating the first and second switching voltages TCKX and TCKY during program and erasure mode includes twenty-seventh, twenty-eighth, twenty-ninth and thirtieth NMOS transistors NM27, NM28, NM29 and NM30 whose one electrodes are commonly connected to the power source voltage VDD terminal, a nineteenth MOS capacitor MC19 connected between the other electrode of the twenty-seventh NMOS transistor NM27 and a fifteenth delay portion for delaying CLK2 signal, a third PMOS pass transistor whose one electrode is connected to the other electrode of the twenty-seventh NMOS transistor NM27, for passing the first switching voltage TCKX, a thirty-first NMOS transistor NM31 formed between the other electrode of the third PMOS pass transistor and the ground voltage VSS terminal, for being operated by inputting a signal of a seventeenth delay portion for delaying CLK2Y signal, a twentieth MOS capacitor MC20 connected between the other electrode of the thirtieth NMOS transistor NM30 and a sixteenth delay portion for delaying CLK2Y signal, a fourth PMOS pass transistor whose one electrode is connected to the other electrode of the thirtieth NMOS transistor NM30, for passing the second switching voltage TCKY, and a thirty-second NMOS transistor NM32 formed between the other electrode of the fourth PMOS pass transistor and the ground voltage VSS terminal, for being operated by inputting a signal of an eighteenth delay portion for delaying CLK2 signal. The gate electrode of the twenty-eighth NMOS transistor NM28 is connected to the other electrodes of the twenty-ninth and thirtieth NMOS transistors NM29 and NM30, and the gate electrode of the twenty-ninth NMOS transistor NM29 is connected to the other electrodes of the twenty-seventh and twenty-eighth NMOS transistors NM27 and NM28. The one electrodes of the twenty-seventh and thirtieth NMOS transistors NM27 and NM30 are connected to each gate electrode thereof. The power source voltage VDD is applied to the gate electrodes of the third and fourth PMOS pass transistors.

Figure 7A:
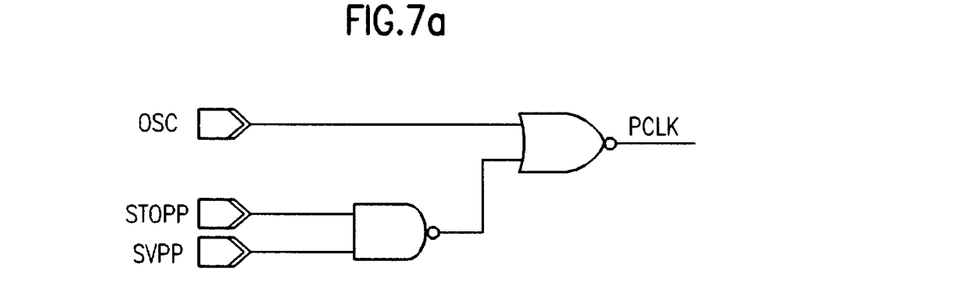
FIGS. 7a–7c are circuit diagrams illustrating an RVPGG generator of FIG. 4.
Figure 7B:
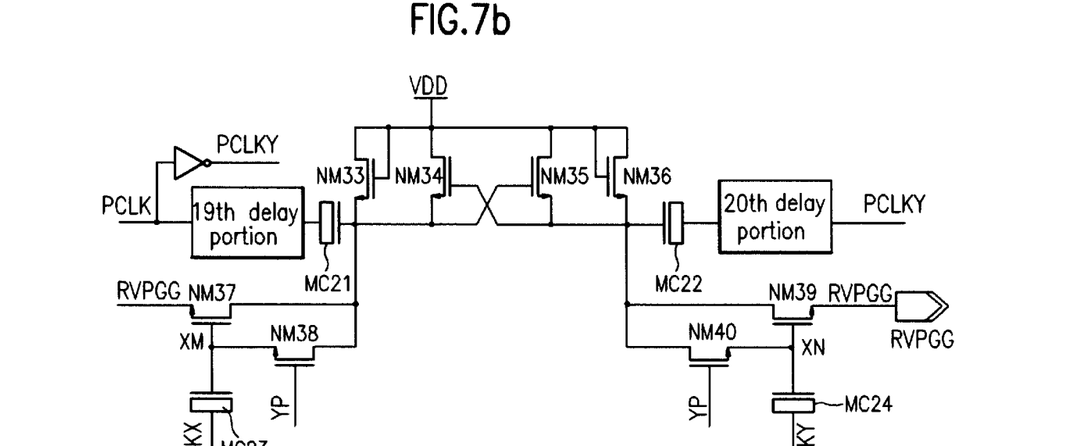
Figure 7C:
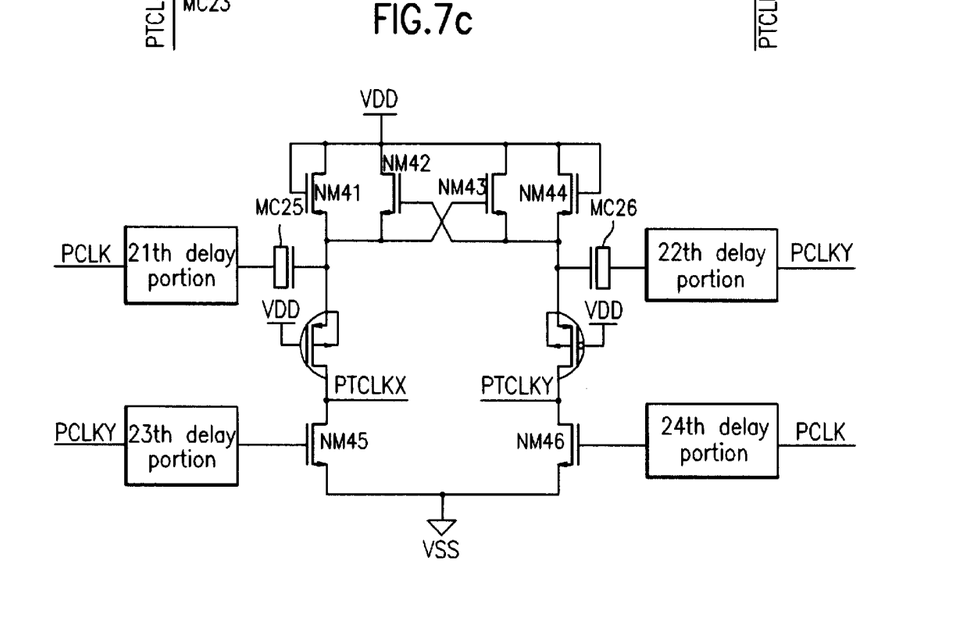

As shown in FIG. 7a–FIG. 7c, the RVPGG generator 42 used during program and erasure mode includes a voltage generator for generating RVPGG, a clock generator for transferring a clock signal to the voltage generator, and a switching voltage generator for generating fifth and sixth switching voltages PTCLKX and PTCLKY.

First, as shown in FIG. 7a, the clock generator includes a NAND gate for performing AND of STOPP signal and SVPP signal and inverting them, and a NOR gate for performing OR of the output signal of the NAND gate and an internal OSC signal and inverting them to output a clock signal PCLK.

As shown in FIG. 7b, the voltage generator includes thirty-third, thirty-fourth, thirty-fifth and thirty-sixth NMOS transistors NM33, NM34, NM35 and NM36 whose one electrodes are commonly connected to the power source voltage VDD terminal, a twenty-first MOS capacitor MC21 connected between the other electrode of the thirty-third NMOS transistor NM33 and a nineteenth delay portion for delaying PCLK signal, a thirty-seventh NMOS transistor NM37 whose one electrode is connected to the other electrode of the thirty-third NMOS transistor NM33 to output RVPGG during program and erasure mode, a fifth switching voltage PTCLKX input terminal for controlling the thirty-seventh NMOS transistor NM37, a twenty-third MOS capacitor MC23 formed between the fifth switching voltage PTCLKX input terminal and a gate electrode of the thirty-seventh NMOS transistor NM37, a thirty-eighth NMOS transistor NM38 connected between the one electrode of the thirty-seventh NMOS transistor NM37 and the gate electrode thereof, a twenty-second MOS capacitor MC22 connected between the other electrode of the thirty-sixth NMOS transistor NM36 and a twentieth delay portion for delaying PCLKY signal, a thirty-ninth NMOS transistor NM39 whose one electrode is connected to the other electrode of the thirty-sixth NMOS transistor NM36 and the other electrode receives RVPGG, a sixth switching voltage PTCLKY input terminal for controlling the thirty-ninth NMOS transistor NM39, a twenty-fourth MOS capacitor MC24 connected between the sixth switching voltage PTCLKY input terminal and a gate electrode of the thirty-seventh NMOS transistor NM39, and a fortieth NMOS transistor NM40 formed between the one electrode of the thirty-ninth NMOS transistor NM39 and a gate electrode thereof.

As shown in FIG. 7c, the switching voltage generator for generating fifth and sixth switching voltages PTCLKX and PTCLKY during program and erasure mode includes forty-first, forty-second, forty-third and forty-fourth NMOS transistors NM41, NM42, NM43 and NM44 whose one electrodes are commonly connected to the power source voltage VDD terminal, a twenty-fifth MOS capacitor MC25 connected between the other electrode of the forty-first NMOS transistor NM41 and a twenty-first delay portion for delaying PCLK signal, a fifth PMOS pass transistor whose one electrode is connected to the other electrode of the forty-first NMOS transistor NM41, for passing the fifth switching voltage PTCLKX, a forty-fifth NMOS transistor NM45 formed between the other electrode of the fifth PMOS pass transistor and the ground voltage VSS terminal, for being operated by inputting a signal of a twenty-third delay portion for delaying PCLKY signal, a twenty-sixth MOS capacitor MC26 connected between the other electrode of the forty-fourth NMOS transistor NM44 and a twenty-second delay portion for delaying PCLKY signal, a sixth PMOS pass transistor whose one electrode is connected to the other electrode of the forty-fourth NMOS transistor NM44, for passing the sixth switching voltage PTCLKY, and a forty-sixth NMOS transistor NM46 formed between the other electrode of the sixth PMOS pass transistor and the ground voltage VSS terminal, for being operated by inputting a signal of a twenty-fourth delay portion for delaying PCLK signal. The gate electrode of the forty-second NMOS transistor NM42 is connected to the other electrodes of the forty-third and forty-fourth NMOS transistors NM43 and NM44, and the gate electrode of the forty-third NMOS transistor NM43 is connected to the other electrodes of the forty-first and forty-second NMOS transistors NM41 and NM42. The one electrodes of the forty-first and forty-fourth NMOS transistors NM41 and NM44 are connected to each gate electrode thereof. The power source voltage VDD is applied to the gate electrodes of the fifth and sixth PMOS pass transistors.

Figure 8A:
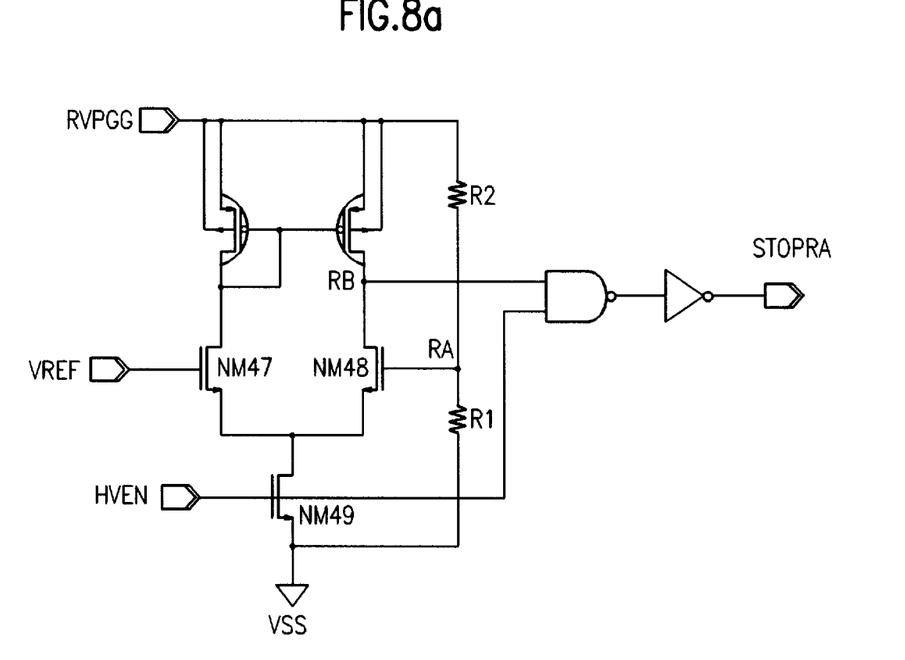
FIGS. 8a–8b are circuit diagrams illustrating an RVPGG adjustment portion of FIG. 4.
Figure 8B:
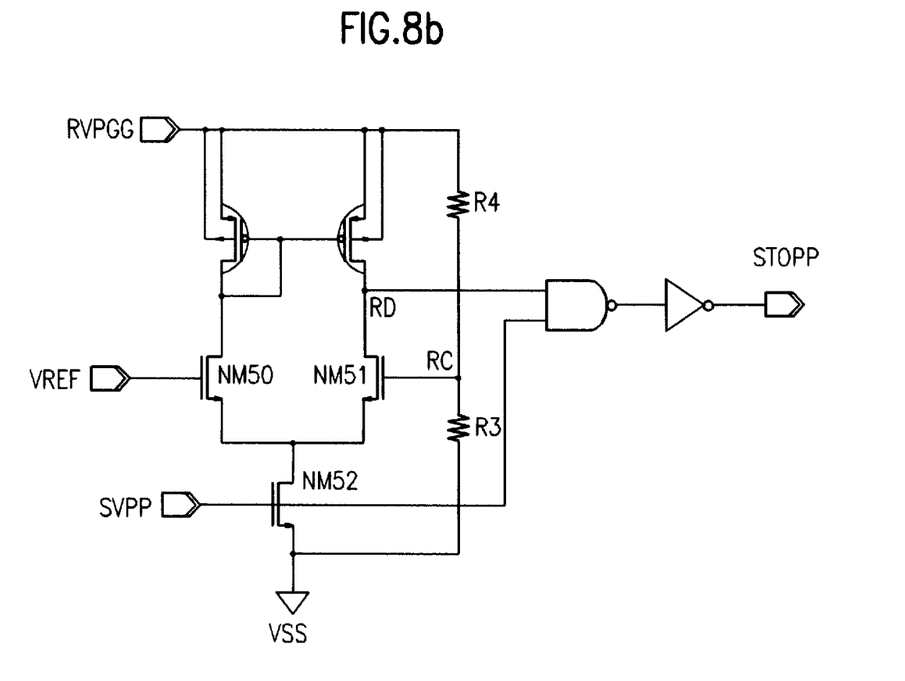

As shown in FIG. 8a–FIG. 8b, the RVPGG adjustment portion 41 includes a first control signal generator for outputting an operation control signal STOPRA of the first clock generator 35 during read and standby mode, and a second control signal generator for outputting an operation control signal STOPP of the RVPGG generator 42 during program and erasure mode.

First, as shown in FIG. 8a, the first control signal generator includes a differential amplifier, a NAND gate, and an inverter.

The differential amplifier includes a forty-seventh NMOS transistor NM47 in which RVPGG is applied to the power source voltage terminal, for being operated by inputting a reference voltage VREF, a forty-eighth NMOS transistor NM48 for being operated by inputting RVPGG voltage, seventh and eighth PMOS pass transistors for transferring the RVPGG to drain terminals of the forty-seventh and forty-eighth NMOS transistors NM47 and NM48, respectively, and a forty-ninth NMOS transistor NM49 formed between a common source terminal of the forty-seventh and forty-eighth NMOS transistors NM47 and NM48 and the ground voltage VSS terminal, for being operated by inputting HVEN signal. A first resistor R1 is connected between a gate electrode of the forty-eighth NMOS transistor NM48 and the ground voltage VSS terminal, and a second resistor R2 is connected between RVPGG input terminal and the gate electrode of the forty-eighth NMOS transistor NM48. The first and second resistors R1 and R2 are connected in parallel between the RVPGG input terminal and the ground voltage VSS terminal, and their intermediate node RA is connected to the gate electrode of the forty-eighth NMOS transistor NM48.

The NAND gate performs AND of an output signal through an output node RB of the differential amplifier and HVEN signal, and inverts them. The inverter inverts the output signal of the NAND gate.

The aforementioned first control signal generator outputs STOPRA signal for controlling the operation of the first clock generator 35.

As shown in FIG. 8b, the second control signal generator includes a differential amplifier, a NAND gate, and an inverter in the same manner as the first control signal generator.

The differential amplifier of the second control signal generator includes a fiftieth NMOS transistor NM50 in which RVPGG is applied to the power source voltage terminal, for being operated by inputting the reference voltage VREF, a fifty-first NMOS transistor NM51 for being operated by inputting RVPGG voltage, ninth and tenth PMOS pass transistors for transferring the RVPGG to drain terminals of the fiftieth and fifty-first NMOS transistors NM50 and NM51, respectively, and a fifty-second NMOS transistor NM52 formed between a common source terminal of the fiftieth and fifty-first NMOS transistors NM50 and NM51 and the ground voltage VSS terminal, for being operated by inputting SVPP voltage. A third resistor R3 is connected between a gate electrode of the fifty-first NMOS transistor NM51 and the ground voltage VSS terminal, and a fourth resistor R4 is connected between RVPGG input terminal and the gate electrode of the fifty-first NMOS transistor NM51. The third and fourth resistors R3 and R4 are connected in parallel between the RVPGG input terminal and the ground voltage VSS terminal, and their intermediate node RC is connected to the gate electrode of the fifty-first NMOS transistor NM51.

The NAND gate of the second control signal generator performs AND of an output signal through an output node RD of the differential amplifier and SVPP signal, and inverts them. The inverter inverts the output signal of the NAND gate.

The aforementioned second control signal generator outputs STOPP signal for controlling the operation of the RVPGG generator 42.

The operation of the aforementioned high voltage generating circuit for a semiconductor memory device according to the present invention will be described with reference to the accompanying drawings.

The operation during program and erasure mode and the operation during read and standby mode will be described, respectively.

During program and erasure mode, as shown in FIGS. 4 and 5a, the clock signals CLK1, CLK2 and CLK3 from each of the first, second and third clock generators 35, 36 and 37 are enabled, so that the first, second and third pumps 38, 39 and 40 are operated.

At this time, RVPGG is maintained at 4.5V and CLK1a is disabled. The first pump 38 is disconnected with the RVPGG adjustment portion 41. Thus, the circuit of FIG. 5b is not operated.

Before the clock signals CLK1, CLK2 and CLK3 are enabled, X1 node and Y1 node of FIG. 5a are maintained at VDD value, and M node and N node are maintained at VDD value, too. Thereafter, if the clock signal CLK1 is enabled from low to high, X1 node is maintained at 2 VDD value and Y1 node is maintained at VDD value. At the same time, if TCKX becomes high of 2 VDD from low, M node is maintained at 3 VDD, so that 2 VDD value of X1 node is output to the first pumping voltage X1_P output node.

If the inverted signal CLK1Y of CLK1 becomes high from low, Y1 node becomes 2 VDD, and at the same time, if TCKY becomes high of 2 VDD from low, N node is maintained at 3 VDD value. Therefore, Y1 node value 2 VDD is output to the Y1_P output node.

Subsequently, as shown in FIGS. 4 and 6a–6b, the second pump 39 which receives the first pumping voltage X1_P and the second pumping voltage Y1_P repeats the above operation so as to transfer 3 VDD value to the nodes CN1 and CN2, 4 VDD value to the nodes CN3 and CN4, and 5 VDD value to the nodes CN5 and CN6. Finally, the output signal VHI of the second pump 39 is output at 6 VDD value. In addition, the third pump 40 performs the same operation as the second pump 39, so that its output signal VVHI is output at 6 VDD value.

The output values VHI and VVHI are then output to the external voltage adjustment portion 43. At this time, if the VHI and VVHI are higher than the reference voltage value, the external voltage adjustment portion 43 enables the STOP2 and STOP3 signals and outputs them to the first, second and third clock generators 35, 36 and 37, so that the first, second and third clock generators 35, 36 and 37 are disabled. Thus, the first, second and third pumps 38, 39 and 40 stop their pumping operation. On the contrary, if the VHI and VVHI are lower than the reference voltage value, the external voltage adjustment portion 43 disables the STOP2 and STOP3 signals, so that the pumping operation continues to perform until a desired voltage is output.

As aforementioned, the second and third pumps 39 and 40 serve to pump the voltages to allow the external voltage adjustment portion 43 and the erase pump 44 to output VPGG, VPG and VPP voltages or erase voltage for program or erasure, respectively.

During program and erasure mode, the RVPGG adjustment portion 41 outputs STOPRA and STOPP signals for controlling the operation of the first clock generator 35 and the RVPGG generator 42. The operation for outputting STOPRA and STOPP signals during program and erasure mode will be described below.

First, as shown in FIG. 7a, the clock generator receives STOPP and SVPP signals of high level and OSC signal of low level, and outputs high signal to the PCLK terminal.

If high signal is applied from the PCLK, XP node in FIG. 7b is maintained at 2 VDD and YP node is maintained at VDD. At the same time, if PTCLKX becomes high of 2 VDD, XM node becomes 3 VDD, so that 2 VDD voltage value of XP node is applied to the RVPGG terminal. Thereafter, if PCLKY becomes high of 2 VDD, YP becomes 2 VDD, and at the same time, if PTCLKY becomes high of 2 VDD, XN node becomes 3 VDD, so that 2 VDD voltage value of YP node is applied to the RVPGG terminal. Thus, the RVPGG value is transferred to the RVPGG adjustment portion 41.

Next, as shown in FIG. 8b, if the RC node is higher than the reference voltage VREF due to RVPGG of high value, the RD node becomes low, so that STOPP is output at low. Thus, PCLK is disabled and the RVPGG generator 42 stops its operation. As shown in FIG. 8a, since HVEN is low and the RB node is low, STOPRA becomes low, so that CLK1 of the first clock generator 35 is enabled and CLK1a thereof is disabled.

If the RC node is lower than the reference voltage VREF due to RVPGG of low value, the RD node becomes high, so that STOPP is output at high. Thus, PCLK is enabled and the RVPGG generator 42 is operated. Even though HVEN is low and the RB node is high, STOPRA becomes low, so that CLK1 of the first clock generator 35 is enabled and CLK1a thereof is disabled. As a result, during program and erasure mode, the pumping operation of the first pump 38 during program and erasure mode is performed. That is, since the first clock generator 35 is operated, the first pump 38 is operated and thus the second pump 39 performs its pumping operation.

As aforementioned, the RVPGG adjustment portion 41 generates STOPP and STOPRA depending on RVPGG value generated from the RVPGG generator 42. Thus, the first clock generator 35 and the first and second pumps 38 and 39 determine whether to perform the pumping operation. The output values of the VPGG, VPG and VPP voltages for program are also determined.

Now, the operation during read and standby mode will be described.

First, since SVPP which is enabled during program and erasure mode is disabled, the second and third clock generators 36 and 37, the second and third pumps 39 and 40, the external voltage adjustment portion 43 and the erase pump 44 are disabled.

On the other hand, HVEN signal is enabled and the first clock generator 35 which receives HVEN signal and OSC signal outputs enabled CLK1a to the first pump 38. Thus, the first pump 38 is operated.

As shown in FIGS. 5a–5b and 6a–6b, TCKX and TCKY are disabled so that a path from the first pump 38 to the second pump 39 is disconnected and the FCLKX and FCLKY are enabled.

The CLK1 and CLK1a are synchronized. If the value of the CLK1 and CLK1a becomes high from low, X1 node is maintained at 2 VDD as shown in FIG. 5a. At this time, if FCLKX is maintained at high level of 2 VDD, L node becomes 3 VDD, so that the value 2 VDD of the X1 node is transferred to the RVPGG.

Subsequently, if CLK1Y becomes high from low, Y1 node is maintained at 2 VDD. At this time, if FCLKY is maintained at high level of 2 VDD, K node becomes 3 VDD, so that the value 2 VDD of the Y1 node is transferred to the RVPGG.

In the RVPGG adjustment portion 41 which receives RVPGG of 2 VDD from the first pump 38, as shown in FIG. 8a, if the RVPGG voltage value is high at the state that HVEN is enabled, the RA node becomes higher than the reference voltage VREF, so that STOPRA becomes high and the first clock generator 35 is disabled. Thus, the first pump 38 stops its pumping operation. If the RVPGG voltage value generated from the first pump 38 is higher than the reference voltage, the RVPGG adjustment portion 41 outputs VPGG value to the row decoder 32.

If the RVPGG voltage value is low, the RA node becomes lower than the reference voltage VREF, so that STOPRA becomes low and the first clock generator 35 is enabled. Thus, the first pump 38 continues to perform the pumping operation until a desired constant RVPGG voltage value is output.

The constant high voltage RVPGG can be applied to the semiconductor memory device by the above operation during read mode.

The aforementioned high voltage generating circuit for a semiconductor memory device according to the present invention has the following advantages.

First, since the constant high voltage relatively higher than the external power source voltage VDD is applied to the wordline of the semiconductor memory device, reading current of the cell depending on distribution of erase threshold voltage Vt of the cell becomes constant, so that stable operation of the chip and fast reading speed can be achieved.

Second, during reading operation, since the constant high voltage is used without any variation due to the external power source voltage, program of the cell can be prevented from being disturbed.

Finally, since reading current of the cell can be adjusted to sensing level, program current can be reduced, thereby reducing overload of the high voltage generator, layout area of the chip, and power consumption.

It will be apparent to those skilled in the art that various modifications and variations can be made in the high voltage generating circuit for a semiconductor memory device according to the present invention without departing from the spirit or scope of the invention. Thus, it is intended that the present invention covers the modifications and variations of the invention provided they come within the scope of the appended claims and their equivalents.

What is claimed is:

1. A high voltage generating circuit for semiconductor memory device having a memory cell array, and a row decoder, a column decoder and a Y-access portion for operating the memory cell array, the circuit comprising:

a first clock generator for generating first and second clock signals CLK1 and CLK1a during read and standby mode and program and erasure mode;

a first pump for outputting a constant high voltage from the first clock signal of the first clock generator during read and standby mode, or generating first and second pumping voltages during program and erasure mode;

a first voltage adjustment portion for outputting a row decoder operation signal from the constant high voltage of the first pump during read and standby mode and maintaining high voltage during program and erasure mode;

second and third clock generators for generating third and fourth clock signals CLK2 and CLK3, respectively, during program and erasure mode;

a second pump for outputting a third pumping voltage from the third clock signal of the second clock generator and the first and second pumping voltages of the first pump during program and erasure mode;

a third pump for outputting a fourth pumping voltage from the fourth clock signal CLK3 of the third clock generator during program and erasure mode;

a second voltage adjustment portion for controlling the operation of the first, second and third clock generators by inputting the third and fourth pumping voltages during program and erasure mode, and outputting each operation voltage of the row decoder, the column decoder and the Y-access portion; and a voltage generator for outputting a constant high voltage to the first voltage adjustment portion during program and erasure mode.

2. The circuit as claimed in claim 1, wherein the first pump includes a first block for generating the first pumping voltage, the second pumping voltage and a constant high voltage, and a first switching voltage generator for generating first and second switching voltages to generate the constant high voltage.

3. The circuit as claimed in claim 2, wherein the first block of the first pump includes:

first, second, third and fourth NMOS transistors whose one electrodes are commonly connected to a power source voltage VDD terminal;

a first MOS capacitor connected between the other electrode of the first NMOS transistor and a first delay portion for delaying the first clock signal CLK1;

a fifth NMOS transistor whose one electrode is connected to the other electrode of the first NMOS transistor;

a sixth NMOS transistor connected between the other electrodes of the first and second NMOS transistors and a gate electrode of the fifth NMOS transistor, whose gate electrode is connected to a gate electrode of the second NMOS transistor and the other electrode of the third NMOS transistor;

a second MOS capacitor connected between the other electrode of the sixth NMOS transistor and a first switching voltage input terminal for outputting the first pumping voltage;

a third MOS capacitor connected between the other electrode of the fourth NMOS transistor and a second delay portion for delaying an inverted clock signal CLK1Y of the first clock signal CLK1;

a seventh NMOS transistor whose one electrode is connected to the other electrode of the third NMOS transistor;

an eighth NMOS transistor connected between the other electrodes of the third and fourth NMOS transistors and a gate electrode of the seventh NMOS transistor, whose gate electrode is connected to the gate electrode of the third NMOS transistor and the other electrode of the second NMOS transistor;

a fourth MOS capacitor formed between the other electrode of the eighth NMOS transistor and a second switching voltage input terminal for outputting the second pumping voltage of the first pump;

a ninth NMOS transistor whose one electrode is connected to the other electrode of the first NMOS transistor;

a fifth MOS capacitor connected between a gate electrode of the ninth NMOS transistor and a third switching voltage input terminal for controlling the ninth NMOS transistor;

a tenth NMOS transistor connected between the one electrode of the ninth NMOS transistor and a gate electrode of the ninth NMOS transistor;

an eleventh NMOS transistor whose one electrode is connected to the other electrode of the fourth NMOS transistor;

a sixth MOS capacitor connected between a gate electrode of the eleventh NMOS transistor and a fourth switching voltage input terminal for controlling the eleventh NMOS transistor; and a twelfth NMOS transistor connected between the one electrode of the eleventh NMOS transistor and the gate electrode of the eleventh NMOS transistor.

4. The circuit as claimed in claim 2, wherein the first switching signal generator of the first pump includes:

thirteenth, fourteenth, fifteenth and sixteenth NMOS transistors whose one electrodes are commonly connected to the power source voltage VDD terminal;

a seventh MOS capacitor connected between the other electrode of the thirteenth NMOS transistor and a third delay portion for delaying the second clock signal CLK1$a$ of the first clock generator;

a first PMOS pass transistor whose one electrode is connected to the other electrode of the thirteenth NMOS transistor, for outputting the third switching voltage;

a seventeenth NMOS transistor formed between the other electrode of the first PMOS pass transistor and the ground voltage VSS terminal, for being operated by inputting a signal of a fifth delay portion for delaying an inverted clock signal CLK1Y$a$ of the second clock signal CLK1$a$;

an eighth MOS capacitor connected between the other electrode of the sixteenth NMOS transistor and a fourth delay portion for delaying the inverted clock signal CLK1Y$a$;

a second PMOS pass transistor whose one electrode is connected to the other electrode of the sixteenth NMOS transistor, for outputting a fourth switching voltage; and an eighteenth NMOS transistor formed between the other electrode of the second PMOS pass transistor and the ground voltage VSS terminal, for being operated by inputting a signal of a sixth delay portion for delaying the second clock signal CLK1$a$.

5. The circuit as claimed in claim 1, wherein the second pump includes a plurality of pumping operation portions for pumping the first and second pumping voltages in turn two or more times, and a second switching voltage generator for generating first and second switching voltages to transfer the pumped voltages of the pumping operation portions to the next node.

6. The circuit as claimed in claim 5, wherein each pumping operation portion of the second pump includes:

a ninth MOS capacitor formed between a first pumping voltage output node of the first pump and a seventh delay portion for delaying an inverted signal CLK2Y of the third clock signal CLK2;

a nineteenth NMOS transistor formed between the first pumping voltage output node and a first contact node;

a twentieth NMOS transistor formed between the first pumping voltage output node and a gate electrode of the nineteenth NMOS transistor;

a second switching voltage input terminal for controlling the nineteenth NMOS transistor;

an eleventh MOS capacitor formed between the gate electrode of the nineteenth NMOS transistor and the second switching voltage input terminal of the second pump;

a tenth MOS capacitor connected between a second pumping voltage output node of the first pump and an eighth delay portion for delaying the third clock signal CLK2;

a twenty-first NMOS transistor formed between the second pumping voltage and a second contact node;

a twenty-second NMOS transistor formed between the second pumping voltage output node and a gate electrode of the twenty-first NMOS transistor;

a first switching voltage input terminal for controlling the twenty-first NMOS transistor; and a twelfth MOS capacitor connected between the gate electrode of the twenty-first NMOS transistor and the first switching voltage input terminal.

7. The circuit as claimed in claim 5, wherein the second switching voltage generator of the second pump includes:

twenty-seventh, twenty-eighth, twenty-ninth and thirtieth NMOS transistors whose one electrodes are commonly connected to the power source voltage VDD terminal;

a nineteenth MOS capacitor connected between the other electrode of the twenty-seventh NMOS transistor and a fifteenth delay portion for delaying the third clock signal CLK2;

a third PMOS pass transistor whose one electrode is connected to the other electrode of the twenty-seventh NMOS transistor, for passing the first switching voltage;

a thirty-first NMOS transistor formed between the other electrode of the third PMOS pass transistor and the ground voltage VSS terminal, for being operated by inputting a signal of a seventeenth delay portion for delaying the inverted clock signal CLK2Y of the third clock signal CLK2;

a twentieth MOS capacitor connected between the other electrode of the thirtieth NMOS transistor and a sixteenth delay portion for delaying the inverted clock signal CLK2Y of the third clock signal CLK2;

a fourth PMOS pass transistor whose one electrode is connected to the other electrode of the thirtieth NMOS transistor, for passing the second switching voltage; and a thirty-second NMOS transistor formed between the other electrode of the fourth PMOS pass transistor and the ground voltage VSS terminal, for being operated by inputting a signal of an eighteenth delay portion for delaying the third clock signal CLK2.

8. The circuit as claimed in claim 1, wherein the voltage generator includes a constant high voltage generator for generating a constant high voltage, a clock generator for generating a fifth clock signal PCLK to the constant high voltage generator, and a third switching voltage generator for generating fifth and sixth switching voltages.

9. The circuit as claimed in claim 8, wherein the constant high voltage generator includes:

thirty-third, thirty-fourth, thirty-fifth and thirty-sixth NMOS transistors whose one electrodes are commonly connected to the power source voltage VDD terminal;

a twenty-first MOS capacitor connected between the other electrode of the thirty-third NMOS transistor and a nineteenth delay portion for delaying the fifth clock signal PCLK;

a thirty-seventh NMOS transistor whose one electrode is connected to the other electrode of the thirty-third NMOS transistor;

a fifth switching voltage input terminal for controlling the thirty-seventh NMOS transistor;

a twenty-third MOS capacitor formed between the fifth switching voltage input terminal and a gate electrode of the thirty-seventh NMOS transistor;

a thirty-eighth NMOS transistor connected between the one electrode of the thirty-seventh NMOS transistor and the gate electrode thereof;

a twenty-second MOS capacitor connected between the other electrode of the thirty-sixth NMOS transistor and a twentieth delay portion for delaying an inverted clock signal PCLKY of the fifth clock signal PCLK;

a thirty-ninth NMOS transistor whose one electrode is connected to the other electrode of the thirty-sixth NMOS transistor and the other electrode receives the constant high voltage;

a sixth switching voltage input terminal for controlling the thirty-ninth NMOS transistor;

a twenty-fourth MOS capacitor connected between the sixth switching voltage input terminal and the gate electrode of the thirty-seventh NMOS transistor; and a fortieth NMOS transistor formed between the one electrode of the thirty-ninth NMOS transistor and a gate electrode thereof.

10. The circuit as claimed in claim 8, wherein the clock generator includes a third NAND gate for performing AND of the control signal of the voltage generator and a program and erase enable signal and inverting them, and a NOR gate for performing OR of the output signal of the third NAND gate and internal OSC signal and inverting them to output the fifth clock signal PCLK.

11. The circuit as claimed in claim 8, wherein the third switching signal generator includes:

forty-first, forty-second, forty-third and forty-fourth NMOS transistors whose one electrodes are commonly connected to the power source voltage VDD terminal;

a twenty-fifth MOS capacitor connected between the other electrode of the forty-first NMOS transistor and a twenty-first delay portion for delaying the fifth clock signal PCLK;

a fifth PMOS pass transistor whose one electrode is connected to the other electrode of the forty-first NMOS transistor, for passing the fifth switching voltage;

a forty-fifth NMOS transistor formed between the other electrode of the fifth PMOS pass transistor and the ground voltage VSS terminal, for being operated by inputting a signal of a twenty-third delay portion for delaying an inverted clock signal PCLKY of the fifth clock signal PCLK;

a twenty-sixth MOS capacitor connected between the other electrode of the forty-fourth NMOS transistor and a twenty-second delay portion for delaying the inverted clock signal PCLKY of the fifth clock signal PCLK;

a sixth PMOS pass transistor whose one electrode is connected to the other electrode of the forty-fourth NMOS transistor, for passing the sixth switching voltage; and a forty-sixth NMOS transistor formed between the other electrode of the sixth PMOS pass transistor and the ground voltage VSS terminal, for being operated by inputting a signal of a twenty-fourth delay portion for delaying the fifth clock signal PCLK.

12. The circuit as claimed in claim 1, wherein the first voltage adjustment portion includes a first signal generator for controlling the first clock generator and a second signal generator for controlling the voltage generator.

13. The circuit as claimed in claim 12, wherein the first signal generator of the first voltage adjustment portion includes a first differential amplifier for being operated by inputting the constant high voltage output from the first pump, the reference voltage and the read and standby enable signal during read and standby mode, a first NAND gate for performing AND of the read and standby enable signal and the output signal of the first differential amplifier, and a first inverter for inverting the signal of the first NAND gate.

14. The circuit as claimed in claim 13, wherein the first differential amplifier includes:

a forty-seventh NMOS transistor for being operated by inputting the reference voltage VREF, in which the constant high voltage is input to a power source voltage terminal;

a forty-eighth NMOS transistor for being operated by inputting the constant high voltage;

seventh and eighth PMOS pass transistors for transferring the constant high voltage to drain terminals of the forty-seventh and forty-eighth NMOS transistors, respectively;

a forty-ninth NMOS transistor formed between a common source terminal of the forty-seventh and forty-eighth NMOS transistors and the ground voltage VSS terminal, for being operated by inputting the read and standby enable signal;

a first resistor connected between a gate electrode of the forty-eighth NMOS transistor and the ground voltage VSS terminal; and a second resistor connected between the constant high voltage input terminal and the gate electrode of the forty-eighth NMOS transistor.

15. The circuit as claimed in claim 12, wherein the second signal generator of the first voltage adjustment portion includes a second differential amplifier for being operated by inputting the constant high voltage output from the voltage generator and a program and erase enable signal, a second NAND gate for performing AND of the program and erase enable signal and the output signal of the second differential amplifier, and a second inverter for inverting the signal of the second NAND gate.

16. The circuit as claimed in claim 15, wherein the second differential amplifier includes:

a fiftieth NMOS transistor for being operated by inputting the reference voltage VREF, in which the constant high voltage is input to a power source voltage terminal;

a fifty-first NMOS transistor for being operated by inputting the constant high voltage;

ninth and tenth PMOS pass transistors for transferring the constant high voltage to drain terminals of the fiftieth and fifty-first NMOS transistors, respectively;

a fifty-second NMOS transistor formed between a common source terminal of the fiftieth and fifty-first NMOS transistors and the ground voltage VSS terminal, for being operated by inputting an enable signal SVPP enabled during program and erasure mode;

a third resistor connected between a gate electrode of the fifty-first NMOS transistor and the ground voltage VSS terminal; and a fourth resistor connected between the constant high voltage input terminal and the gate electrode of the fifty-first NMOS transistor.

* * * * *